US008351559B1

(12) United States Patent
Thomas (10) Patent No.: US 8,351,559 B1
(45) Date of Patent: Jan. 8, 2013

(54) SAMPLE TIME CORRECTION FOR MULTIPHASE CLOCKS

(75) Inventor: Christopher Thomas, San Diego, CA (US)

(73) Assignee: SMSC Holdings S.a.r.l., Luxembourg (LU)

( * ) Notice: Subject to any disclaimer, the term of this patent is extended or adjusted under 35 U.S.C. 154(b) by 312 days.

(21) Appl. No.: 12/759,574

(22) Filed: Apr. 13, 2010

(51) Int. Cl.
 *H04L 7/00* (2006.01)
(52) U.S. Cl. ........................ 375/355; 375/354; 375/359
(58) Field of Classification Search .................. 375/355
 See application file for complete search history.

(56) References Cited

U.S. PATENT DOCUMENTS

| | | | |
|---|---|---|---|
| 7,742,520 B2 * | 6/2010 | Simpson et al. | 375/229 |
| 7,900,098 B2 * | 3/2011 | Becker et al. | 714/708 |
| 7,991,099 B2 * | 8/2011 | Xia et al. | 375/355 |
| 7,991,103 B2 * | 8/2011 | Song | 375/376 |
| 8,121,239 B2 * | 2/2012 | Yin et al. | 375/355 |
| 2003/0086339 A1 * | 5/2003 | Dally et al. | 368/202 |
| 2005/0018798 A1 * | 1/2005 | Li | 375/355 |
| 2005/0157780 A1 * | 7/2005 | Werner et al. | 375/232 |
| 2005/0157781 A1 * | 7/2005 | Ho et al. | 375/233 |
| 2005/0238093 A1 * | 10/2005 | Payne et al. | 375/224 |
| 2006/0002502 A1 * | 1/2006 | Abhayagunawardhana et al. | 375/373 |
| 2006/0067391 A1 * | 3/2006 | Garlepp | 375/224 |
| 2006/0158225 A1 * | 7/2006 | Stojanovic et al. | 326/87 |
| 2006/0227912 A1 * | 10/2006 | Leibowitz et al. | 375/350 |
| 2006/0274874 A1 * | 12/2006 | Kumar et al. | 375/362 |
| 2007/0047683 A1 * | 3/2007 | Okamura et al. | 375/355 |
| 2007/0080718 A1 * | 4/2007 | Stojanovic et al. | 326/87 |
| 2007/0263757 A1 * | 11/2007 | Dally et al. | 375/376 |
| 2008/0144760 A1 * | 6/2008 | Song et al. | 375/371 |
| 2009/0074126 A1 * | 3/2009 | Song | 375/376 |
| 2009/0252265 A1 * | 10/2009 | Xia et al. | 375/355 |
| 2009/0316727 A1 * | 12/2009 | Huang et al. | 370/488 |
| 2010/0117706 A1 * | 5/2010 | Stojanovic et al. | 327/306 |
| 2010/0135378 A1 * | 6/2010 | Lin et al. | 375/233 |
| 2010/0264969 A1 * | 10/2010 | Cheung | 327/158 |
| 2010/0266006 A1 * | 10/2010 | Werner et al. | 375/232 |
| 2010/0309791 A1 * | 12/2010 | Fuller et al. | 370/242 |
| 2011/0064176 A1 * | 3/2011 | Takada | 375/355 |
| 2011/0090947 A1 * | 4/2011 | Peng et al. | 375/233 |
| 2011/0239030 A1 * | 9/2011 | Ware et al. | 713/400 |
| 2011/0239031 A1 * | 9/2011 | Ware et al. | 713/500 |

\* cited by examiner

*Primary Examiner* — David Ometz
*Assistant Examiner* — Santiago Garcia (57) ABSTRACT

Systems and methods are provided to permit indirect measurements of sample time errors using multiphase interpolator clocks generated from a local reference clock in clock recovery blocks of high speed data receivers. The multiphase interpolator clocks are adjusted to have substantially evenly spaced phase offsets within a data period of the local reference clock. A small frequency offset between the transmitter clock and the local reference clock causes transition edges of received data to drift slowly across the interpolated clocks. Differences in phase offsets between the interpolated clocks may be determined with high resolution by counting the number of data transitions occurring between pairs of interpolated clocks over a long period of time. Phase offsets are adjusted to make the data transition counts substantially the same for the interpolated clocks. Data recovery may then be facilitated by selecting an interpolated clock with a sampling edge that is closest to the center of a data period to sample the received data.

22 Claims, 8 Drawing Sheets

SAMPLE TIME CORRECTION FOR MULTIPHASE CLOCKS

BACKGROUND

1. Field of the Invention

The present invention generally relates to data communication and, more particularly, to sampling data in communication receivers.

2. Related Art

In data communication, data transmitted from remote transmitting devices are often received and sampled by receivers. The remote transmitting devices may transmit data using clock sources that are not transmitted to the receivers. For the receivers to sample received data, the receivers may provide their own clocks that have nominally the same frequency as the frequency of the transmitting clocks on the remote transmitting devices.

In practice, clocks may be generated from crystals and oscillator circuits. Manufacturing tolerances of the crystals and oscillator circuits may cause small deviations in the frequency characteristics of the generated clocks from their nominal values. In addition, operating conditions such as fluctuations in voltage and temperature may induce further variance in the clock characteristics. As such, clock characteristics of receiver clocks and transmitting clocks may not be exactly identical. Consequently, received data and receiver clocks are not synchronous.

Because receiver clocks are not synchronous to the received data, their timing relationship may change over time. Nevertheless, it may be advantageous to be able to generate and adjust sampling points of the receiver clocks used to sample the received data such that the sampling points have a known relationship to the received data. For example, in high speed data receivers, maximum performance may be achieved when received data are sampled close to the midpoint between data transitions. Because the accuracy of sampling the received data is limited by the accuracy of the sampling points of the received clocks, the sampling points must be carefully controlled. Therefore, it is desirable to measure sample time errors and to adjust the receiver clocks to minimize the sample time errors. Once this sample time correction is performed, data recovery may be facilitated by selecting one or more clocks with sampling points close to the midpoint between data transitions to sample the received data.

While it may be possible to measure directly the variance in data sampling time from the ideal time to obtain sample time errors, direct measurements of sample time errors are not economical for high speed data. Accordingly, there is a need for an improved approach that permits indirect measurements of sample time errors when sampling high speed data. The sample time errors may then be used to adjust sampling edges of receiver clocks to better track the data.

SUMMARY

Systems and methods are provided to permit indirect measurements of sample time errors using multiphase interpolator clocks in clock recovery blocks of high speed data receivers. The multiphase interpolator clocks are adjusted to have even phase within a data period of a local reference clock. Having the multiphase interpolator clocks facilitates selections of receiver clocks with sampling edges that maximize data recovery.

In accordance with one or more embodiments of the present disclosure, a method of adjusting a plurality of interpolating clocks having a first frequency and different phase offsets is provided. The method includes receiving a serial stream of data bits clocked with a second frequency. The method also includes accumulating the number of data transitions of the data bits occurring during each phase offset interval between successive pairs of the interpolating clocks to generate a data bit transition count for each interpolating clock. The method further includes comparing the data bit transition counts for all interpolating clocks. From the results of comparisons of the data bit transition counts for all interpolating clocks, the method adjusts the phase offsets of the interpolating clocks. The method further includes repeatedly accumulating the data bit transitions counts, comparing the data bit transitions counts, and adjusting the phase offsets of the interpolating clocks until the data bit transition counts for all interpolating clocks are substantially equal so that the phase offsets of the interpolating clocks are substantially evenly spaced.

In accordance with one or more embodiments of the present disclosure, a clock recovery apparatus includes a plurality of oversampling registers to sample a serial stream of data bits. The plurality of oversampling registers generate oversampled data using sampling edges of a plurality of corresponding interpolating clocks having a common first frequency and different phase offsets. The serial stream of data bits is clocked with a second frequency. The apparatus includes a transition detect block that receives the oversampled data for detecting data transitions occurring between the sampling edges of adjacent interpolating clocks. The apparatus also includes an accumulator block for accumulating the data transitions to generate data transition counts occurring between the sampling edges of the adjacent interpolating clocks over an accumulation period. The apparatus further includes an error detect to compare the data transition counts from the accumulator block to generate phase errors. The phase errors represent deviations of the phase offsets of the plurality of interpolating clocks from interpolating clocks having substantially equal phase offsets. The apparatus further includes a clock interpolating block to generate the plurality of interpolating clocks from a reference clock and to adjust the phase offsets of the plurality of interpolating clocks in response to the phase errors from the error detect block.

In accordance with one or more embodiments of the present disclosure, a machine readable medium stores a plurality of machine readable instructions which when executed causes a data communication device to perform a method of adjusting a plurality of interpolating clocks having a first frequency and different phase offsets. The method includes receiving a serial stream of data bits clocked with a second frequency. The method also includes accumulating the number of data transitions of the data bits occurring during each phase offset interval between successive pairs of the interpolating clocks to generate a data bit transition count for each interpolating clock. The method further includes comparing the data bit transition counts for all interpolating clocks. From the results of comparisons of the data bit transition counts for all interpolating clocks, the method adjusts the phase offsets of the interpolating clocks. The method further includes repeatedly accumulating the data bit transitions counts, comparing the data bit transitions counts, and adjusting the phase offsets of the interpolating clocks until the data bit transition counts for all interpolating clocks are substantially equal so that the phase offsets of the interpolating clocks are substantially evenly spaced.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

The present disclosure relates to systems and methods for improving clock recovery in data receivers by generating, monitoring, and adjusting sampling clocks used to sample high speed data. High speed data is generated from data sources using clocks local to the data sources. In one embodiment, the data sources may transmit only the data, but not the clocks to the data receivers. As such, to recover the data, the data receivers sample the received data using sampling clocks that are not locked to the data source clocks. To maximize data recovery, the sampling clocks may sample the data close to the midpoint between data transitions, commonly referred to as the center of the "eye" of data transitions. Because the sampling clocks are not locked to the data source clocks, and therefore are asynchronous to the received data, the sampling clocks may drift relative to the received data, making it difficult to maintain the sampling clocks in the center of the eye. Embodiments of the present disclosure may generate and maintain multiple interpolated clocks having a common frequency but are separated by substantially equally spaced phase offsets. Data recovery may be facilitated by selecting as the sampling clock an interpolated clock with a sampling edge that is closest to the center of the eye even as the timing relationship between the sampling clock and the data changes. Hereinafter, embodiments of the present disclosure will be explained in detail with reference to the accompanying figures.

In the figures, where applicable, devices and/or blocks may be implemented as dedicated hardware, configurable hardware, firmware, software, and/or any desired combination thereof. When implemented as software, the software may be stored in one or more machine readable mediums to be read and executed by one or more processors. The choice of implementation may be dictated by considerations such as speed, flexibility, scalability, complexity, and cost.

Figure 1:
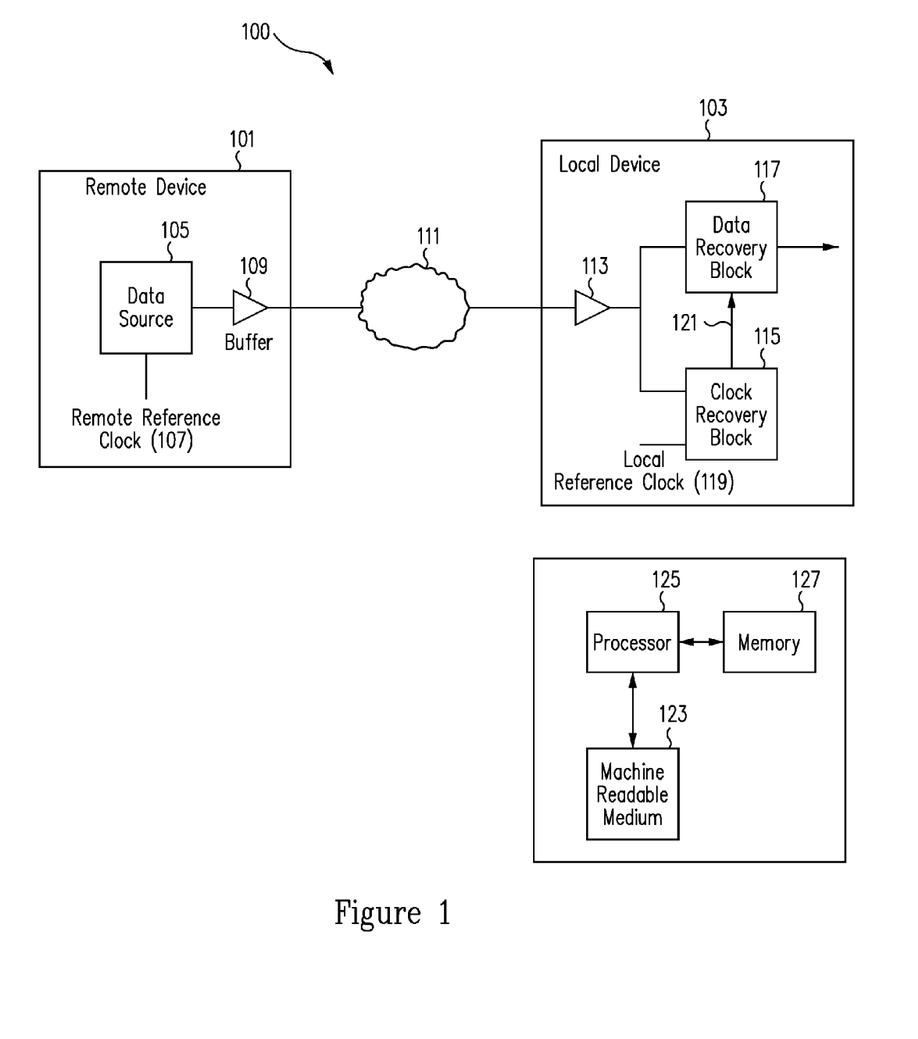
FIG. 1 shows a communication system in which a remote device transmits data to a local device according to one or more embodiments of the present disclosure.

FIG. 1 shows a communication system 100 in which a remote device 101 transmits data to a local device 103 according to one or more embodiments of the present disclosure. Examples of remote device 101 may include computing devices, storage devices, network communication devices, media devices, satellites, sensors, or other appropriate devices. Remote device 101 includes a data source 105 that generates the data using a remote reference clock 107. Therefore, the data from data source 105 may change at the frequency of remote reference clock 107. Data source 105 may also encode and format the data to comply with various data protocols. For example, in one embodiment, data source 105 may encode the data in 8b/10b coding and format the data to comply with USB 3.0 protocol. Other encoding and formatting may be used in other embodiments. The data may be further filtered and up-converted to have the desired signal bandwidth and/or the desired carrier frequency. A buffer 109 drives the data onto a transmission medium 111, which may be a direct connection, a wired and/or wireless network, and/or any other desired medium.

The transmitted data is received by the local device 103 through a buffer 113. Examples of local device 103 may include the same types of devices that were identified for remote device 101. Because remote reference clock 107 is not transmitted by remote device 101 with the data, local device 103 may need to generate a sampling clock locally to recover the data. In this regard, local device 103 includes a clock recovery block 115 and a data recovery block 117. Clock recovery block 115 uses the received data and a local reference clock 119 to generate a sampling clock 121. Data recovery block 117 uses sampling clock 121 to sample the received data and to carry out further receiver processing such as demodulation and decoding. Alternatively, local device 103 may be implemented as software stored on a machine readable medium 123 and executed by a system including one or more processors 125 and memories 127.

To maximize data recovery, it is desired to generate sampling clock 121 with a sampling edge that is close to the center of the eye of data transitions. However, because remote reference clock 107 and local reference clock 119 may not have exactly the same frequency characteristics, there may be a frequency offset between the two clocks. This frequency offset may be attributable to the manufacturing tolerances of crystals and oscillators used to generate clocks, to operating conditions such as voltage, temperature, and to changes in frequency characteristics of the crystals themselves as they age. Generally, the frequency offset is small and may be measured in 100 PPM (parts per million). However, over time, the frequency offset causes sampling clock 121 to drift with respect to the center of the eye of the received data. Therefore, to facilitate data recovery, clock recovery block 115 generates multiple interpolated clocks having a common frequency but substantially equally spaced phase offsets using local reference clock 119.

Because the multiple interpolated clocks are generated from local reference clock 119, phase noise on local reference clock 119 introduces variance in the phase offsets between the multiple interpolated clocks. In addition, minor differences in implementation circuitries of the multiple interpolated clocks such as circuit layouts, and component tolerances contribute further to the variance in the phase offsets. The variance in the phase offsets manifests as variance in the sampling edges of the multiple interpolated clocks. To maximize data recovery in a high speed data receiver, it is desirable to reduce the variance in the phase offsets between the multiple interpolated clocks. Therefore, clock recovery block 115 measures the phase offsets between the multiple interpolated clocks and, in response to the measurements, adjusts the phase offsets to maintain substantially equal phase offsets between the multiple interpolated clocks. Doing so allows clock recovery block 115 to select sampling clock 121 with a sampling edge closest to the center of the data to sample the data.

Figure 2:
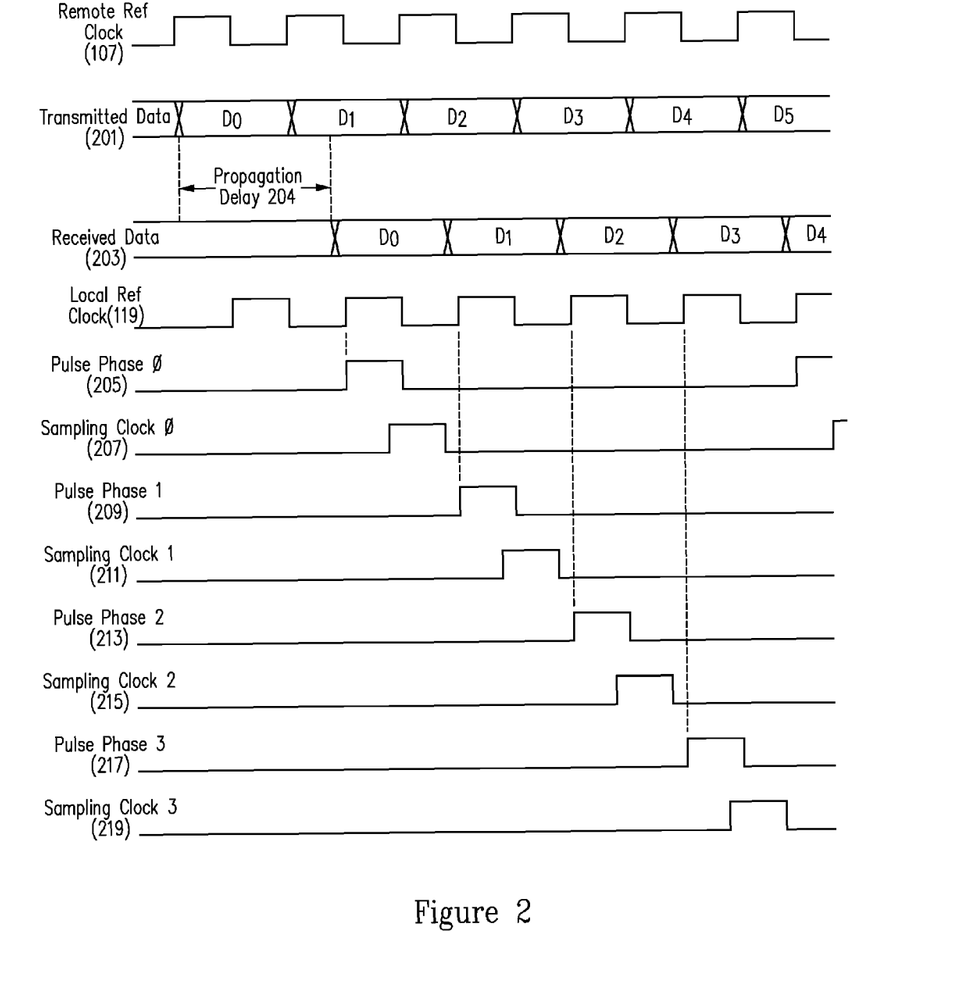
FIG. 2 shows a timing relationship between remote and local reference clocks and various other clocks in a local device according to one or more embodiments of the present disclosure.

FIG. 2 shows a timing relationship between remote reference clock 107 and local reference clock 119 and various other clocks in local device 103 according to one or more embodiments of the present disclosure. Remote reference clock 107 is used by remote device 101 of FIG. 1 to generate transmitted data 201. Therefore, transmitted data 201 may switch at the frequency of remote reference clock 107. Transmitted data 201 propagates through transmission medium 111 of FIG. 1 and is received as received data 203 by local device 103 after a propagation delay 204. Received data 203 is sampled using sampling clock 121 generated from local reference clock 119. Because propagation delay 204 is variable and also because local reference clock 119 is not synchronized to remote reference clock 107, received data 203 is not synchronous to sampling clock 121.

As mentioned, clock recovery block 115 of FIG. 1 generates multiple interpolated clocks that are separated by substantially equal phase offsets. Clock recovery block 115 selects one of the interpolated clocks having a sampling edge closest to the center of data transitions to be used as sampling clock 121 to sample received data 203. For high speed data, there may be more than one such sampling clock. One advantage of using multiple sampling clocks is to slow down the clock speed required to process high speed data stream.

For example, there may be N sampling clocks with each sampling clock used to sample one of a group of N consecutive received data bits or symbols. The N sampled data may be captured by N registers using the N sampling clocks so that the N sampled and captured data may be processed in parallel to reduce the clock speed for processing received data stream by a factor of N. Thus, the N sampling clocks are used to effectively de-serialize received data to reduce downstream pressing speed at a cost of an increase in hardware complexity. N is generally chosen to strike a balance between processing speed and implementation cost. Clock recovery block 115 may generate N sets of multiple interpolated clocks for each of the N sampling clocks. Each set of multiple interpolated clocks may be generated from one of N different phases of local reference clock 119. For each of the N sampling clocks, clocks recovery block 115 may select one interpolated clock from the corresponding set of multiple interpolated clocks having a sampling edge closest to the center of data transitions to be used as the sampling clock.

For example, FIG. 2 shows the use of four sampling clocks (N=4) to de-serialize received data 203. Pulse phase 0 (205), pulse phase 1 (209), pulse phase 2 (213), and pulse phase 3 (217) represent four different phases of local reference clock 119. Each of the four pulse phases is used to generate a corresponding set of M interpolated clocks by clock recovery block 115. From each set of M interpolated clocks, clock recovery block 115 then selects an interpolated clock with a sampling edge closest to the center of data transitions as the sampling clock. For example, from the set of M interpolated clocks generated from pulse phase 0 (205), sampling clock 0 (207) is selected as having a sampling edge closest to the center of D0. Similarly, from the sets of M interpolated clocks generated from pulse phase 1 (209), pulse phase 2 (213), and pulse phase 3 (217), sampling clock 1 (211), sampling clock 2 (215), and sampling clock 3 (219) are selected as having sampling edges closest to the center of D1, D2, and D3, respectively. Each of sampling clocks 0 through 3 (207, 211, 215, 219) is running at ¼ of the frequency of local reference clock 119 to capture D0, D1, D2, D3, of received data 203, respectively, into one of four registers. After D0 through D3 are captured, the four de-serialized data samples may be processed downstream in parallel at ¼ the frequency of local reference clock 119. The capturing of four de-serialized data samples using sampling clocks 0 through 3 (207, 211, 215, 219) and the downstream parallel processing is repeated for each groups of four consecutive data samples.

As will be further explained, the M interpolated clocks for each sampling clock are separated by 1/M of the period between successive pairs of pulse phases. For example, the M interpolated clocks generated from pulse phase 0 (205) are separated by 1/M of the period between pulse phase 0 (205) and pulse phase 1 (209). Because the frequency offset between remote reference clock 107 and local reference clock 119 may be small, the M interpolated clocks drift very slowly with respect to the eye of received data 203. Therefore, the interpolated clock having rising edges closest to the center of the eye and used to provide sampling clock 121 will in most cases be the same interpolated clock across a short period of time. However, over a long period of time, the M interpolated clocks drifts across the eye of received data 203. As a result, different interpolated clocks with a rising edge closer to the center of the eye may be used to provide sampling clock 121.

It is noted that in one or more embodiments, local reference clock 119 may have a frequency that is substantially different from the frequency of remote reference clock 107. As such, a frequency synthesizer may use local reference clock 119 to generate a synthesized clock having a frequency closer to the frequency of remote reference clock 107. N different phases of the synthesized clock may then be used to generate the sets of M interpolated clocks.

Figure 3:
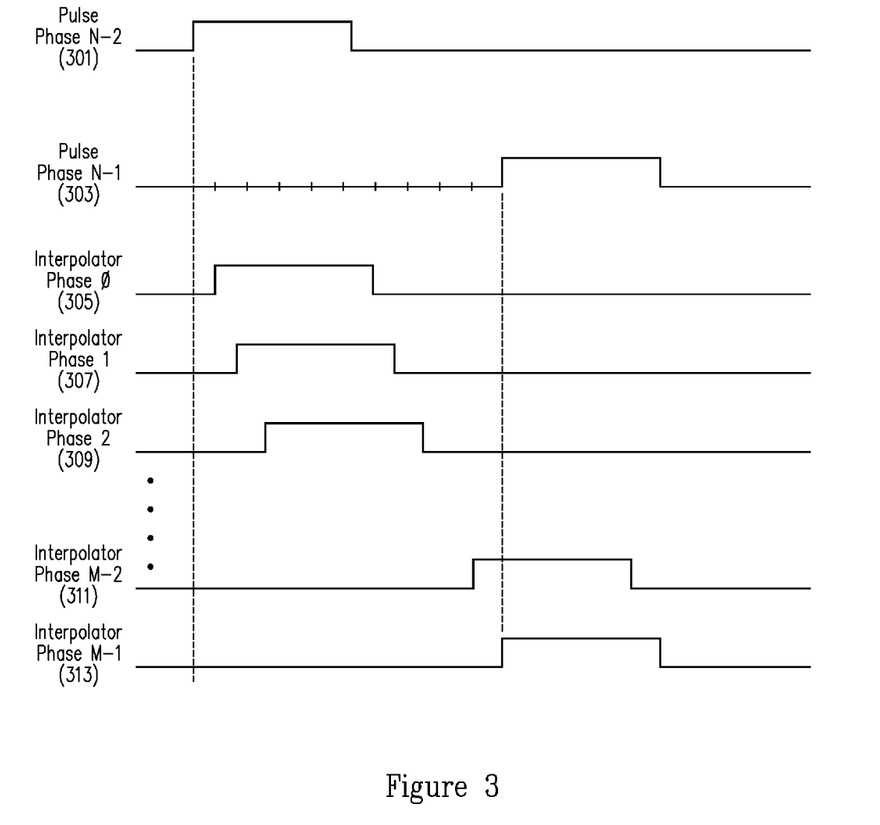
FIG. 3 shows a phase relationship between interpolated clocks and a successive pair of pulse phases of a local reference clock according to one or more embodiments of the present disclosure.

FIG. 3 shows a phase relationship between the M interpolated clocks and a successive pair of pulse phases of a local reference clock according to one or more embodiments of the present disclosure. Pulse phase N−2 (301) and pulse phase N−1 (303) represent two successive phases of local reference clock 119. If there are N different phases of local reference clock 119, pulse phases N−2 (301) and N−1 (303) would have a frequency of 1/N of the frequency of local reference clock 119 and the pulse phases would be separated by one period of local reference clock 119. Using pulse phase N−2 (301), M interpolated phases are generated. Interpolator phase 0 (305), interpolator phase 1 (307), interpolator phase 2 (309), through interpolator phase M−1 (313) represent the M interpolated phases for pulse phase N−2 (301). For N pulse phases and M interpolated phases generated from each pulse phase, there are a total of N×M interpolated phases. To maximize data recovery performance, it is desirable that the M interpolated phases have the same frequency as pulse phase N−2 (301) and are evenly spaced by 1/M of a period of local reference clock 119.

However, due to variations in circuit layout, tolerances in device parameters, operating conditions, jitters on the pulse phases, and other factors, the M interpolated phases may not be substantially evenly spaced. Therefore, clock recovery block 115 makes measurements of the phase offsets of the M interpolated phases and in response to the measurements makes fine adjustment to the M interpolated phases to make them substantially evenly spaced. In one or more embodiments, clock recovery block 115 may adjust a location of the interpolated phases by one of a number of discrete steps.

It may not be economical to make direct measurements of the phase offsets of the M interpolated phases due to the high clock speed and the high resolution required. An indirect, more economical way to measure the phase offsets of the M interpolated phases is to take advantage of the frequency offset between remote reference clock 107 and local reference clock 119. As mentioned, the frequency offset causes the M interpolated clocks to drift very slowly with respect to the eye of received data 203. Put in another way, the transition edges of received data 203 drift slowly across the M interpolated clocks. Assuming that the frequency offset remains fairly constant, the time it takes for the transition edges of received data 203 to drift across the phase offsets between the M interpolated clocks gives a relative measurement of the phase offsets. Thus, relying on the small frequency offset between remote reference clock 107 and local reference clock 119, the differences in phase offsets between M interpolated clocks may be determined with high resolution by measuring the time it takes for the transition edges of received data 203 to drift across the M interpolated clocks over a long period of time.

Figure 4:
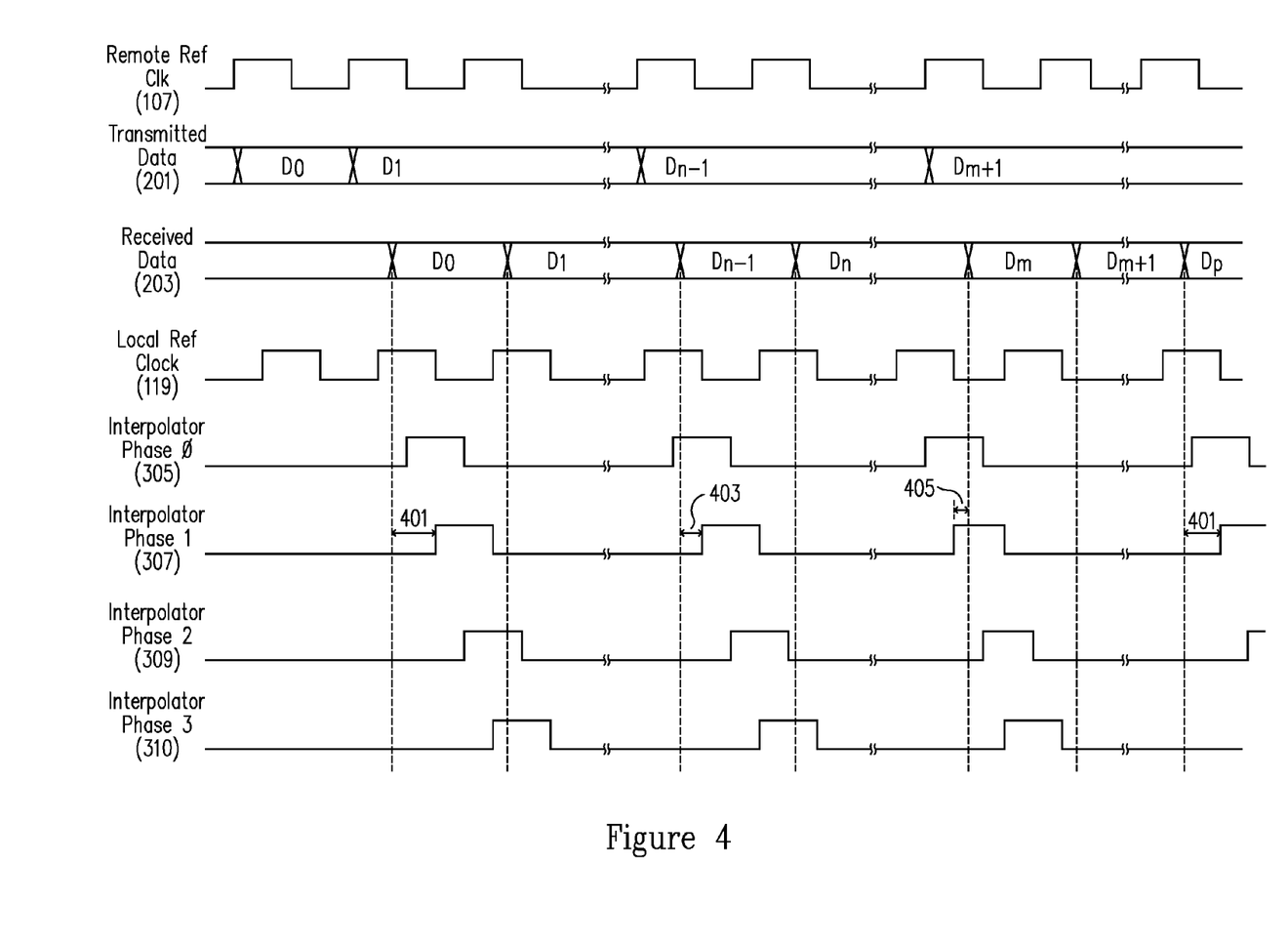
FIG. 4 illustrates data transitions of received data drifting across interpolated clocks due to a frequency offset between a remote reference clock and a local reference clock according to one or more embodiments of the present disclosure.

FIG. 4 illustrates the data transitions of the received data drifting across the M interpolated clocks due to a frequency offset between the remote reference clock and the local reference clock according to one or more embodiments of the present disclosure. In FIG. 4, there are 4 interpolated clocks (M=4). The remote device transmits transmitted data 201 using remote reference clock 107. Transmitted data 201 is received by the local device as received data 203. The local device uses local reference clock 119 to generate pulse phases, which are in turn used to generate interpolator phases 0 through 3 (305, 307, 309, 310). The frequency offset between remote reference clock 107 and local reference clock 119 is generally small (e.g., on the order of 100 parts per million (PPM) in one embodiment). If the frequency offset is 100 PPM and stays constant, it would take 10,000 clock periods for local reference clock 119 to drift across one period of remote reference clock 107 or across one period of received data 203.

Interpolator phases 0 through 3 (305, 307, 309, 310) are evenly spaced within a period of local reference clock 119. Initially, among the four interpolator clocks, interpolator phase 1 (307) has a sampling edge (e.g., a rising edge in one embodiment) closest to the center of $D_0$ of received data 203. Interpolator phase 1 (307) will then be selected as the sampling clock for $D_0$. If a data period of received data 203 is treated as having a phase of $2\pi$, there is an initial phase difference 401 between the start of $D_0$ and the sampling edge of interpolator phase 1 (307). Due to the 100 PPM frequency offset, it would take 10,000 clock periods of local reference clock 119 for the four interpolator phases to drift across one data period of received data 203. Therefore, after 2,500 clock periods of local reference clock 119, the phase difference between the start of $D_{n-1}$ of received data 203 and the sampling edge of interpolator phase 1 (307) is reduced by $\pi/2$ from initial phase difference 401 to yield a new phase difference 403. As a result, interpolator phase 2 (309) has a sampling edge closer to the center of $D_{n-1}$ than interpolator phase 1 (307) and interpolator phase 2 (309) is selected as the sampling clock for $D_{n-1}$. After another 2,500 clock periods of local reference clock 119, the phase difference between the start of $D_m$ of received data 203 and the rising edge of interpolator phase 1 (307) is reduced by another $\pi/2$ to yield a phase difference 405. Similarly, the phase difference between the start of $D_m$ and the rising edge of interpolator phase 2 (309) is reduced by $\pi/2$. As a result, interpolator phase 3 (310) has a sampling edge closest to the center of $D_m$ and interpolator phase 3 (310) is now selected as the sampling clock for $D_m$. In this way, the sampling clock will next rotate to interpolator phase 0 (305) and then eventually back to interpolator phase 1 (307) when it is re-aligned with $D_p$ with initial phase difference 401.

Thus, in the above example, a new interpolator phase is selected as the new sampling clock after every 2,500 clocks if the four interpolator phases are evenly spaced and the frequency offset remains constant. If the interpolator phases are not evenly spaced, then the number of local reference clock 119 it takes to rotate the sampling clock between the interpolator phases is proportional to the phase offsets between the interpolator phases. Therefore, by measuring the number of clock periods of local reference clock 119 it takes for data transitions to drift between the M interpolated clocks over a sufficiently long period of time, the phase offsets between the M interpolated clocks may be determined and adjusted accordingly.

Figure 5:
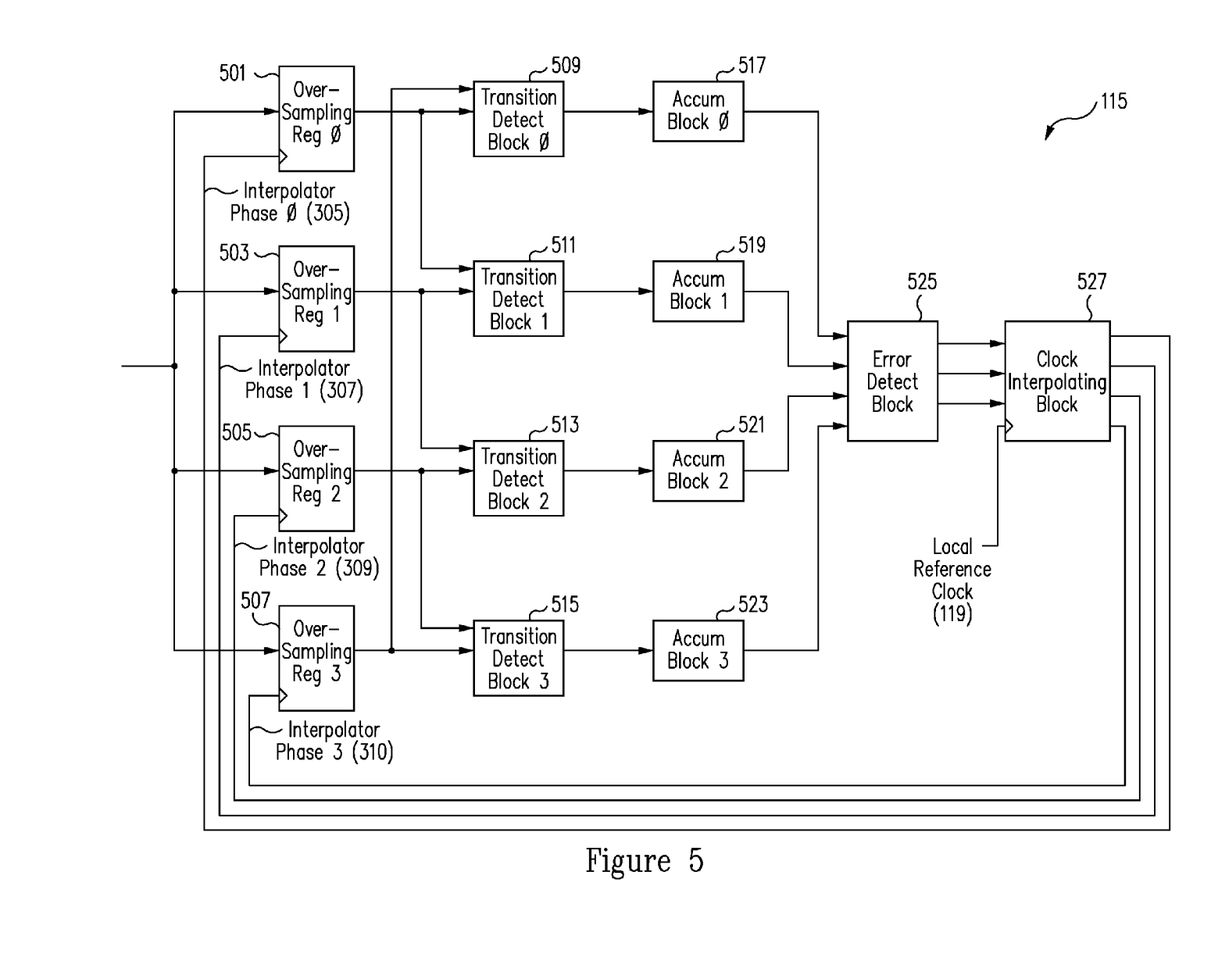
FIG. 5 shows an implementation of clock recovery blocks to measure phase offsets between multiple interpolated clocks and to adjust the phase offsets to maintain substantially equal phase offsets between the multiple interpolated clocks according to one or more embodiments of the present disclosure.

FIG. 5 shows an implementation of clock recovery block 115 to measure the phase offsets between multiple interpolated clocks and to adjust the phase offsets to maintain substantially equal phase offsets between the multiple interpolated clocks according to one or more embodiments of the present disclosure. The number of interpolated clocks in clock recovery block 115 of FIG. 5 is four (M=4). Clock recovery block 115 counts the number of data transitions between sampling edges of adjacent pairs of the four interpolated clocks to obtain an indirect measurement of the phase offsets. The data transition count is proportional to the time delay or phase offset between sampling edges of adjacent pairs of the four interpolated clocks. By adjusting the phase offsets of the four interpolated clocks to make the data transition counts substantially equal between pairs of interpolated clocks, the four interpolated clocks may be made to have substantially equal phase offsets. Using the data transition counts as an indirect measurement of the phase offsets between the interpolated clocks relies on data with a high transition density and having an approximately uniform distribution of different states. For example, in one embodiment, data source 105 of FIG. 1 may use 8b/10b coding to provide data with such properties. Other types of coding may be used in other embodiments where appropriate.

Received data is captured by four oversampling registers 0 through 3 (501, 503, 505, 507) clocked with four interpolator phases 0 through 3 (305, 307, 309, 310), respectively. If there is a data transition, the states of the four oversampling registers 0 through 3 (501, 503, 505, 507) may indicate the position of the data transition relative to the four interpolator phases 0 through 3 (305, 307, 309, 310). For example, if there is a data transition between the sampling edges of interpolator phases 0 and 1 (305, 307), oversampling register 0 (501) would have a different state from those of oversampling registers 1, 2, and 3 (503, 505, 507). This is the scenario of received data $D_{n-1}$ illustrated in FIG. 4. Oversampling registers 0 through 3 (501, 503, 505, 507) generate oversampled data 0 through 3, respectively.

To detect data transitions between two interpolator phases, transition detect blocks 0 through 3 (509, 511, 513, 515) check for differences between oversampled data of the corresponding oversampling registers 0 through 3 (501, 503, 505, 507) clocked with the two interpolator phases. For example, transition detect block 1 (511) checks for a difference between oversampled data 0 and 1 from oversampling registers 0 and 1 (501, 503) to detect data transitions between interpolator phases 0 and 1 (305, 307). If the two states are different, a data transition has occurred between the sampling edges of interpolator phases 0 and 1 (305, 307). The four transition detect blocks 0 through 3 (509, 511, 513, 515) detect data transitions between the sampling edges of interpolator phases 3 and 0 (310, 305), of interpolator phases 0 and 1 (305, 307), of interpolator phases 1 and 2 (307, 309), and of interpolator phases 2 and 3 (309, 310), respectively. As received data drift across the four interpolated phases, data transitions are detected by successive transition detect blocks 0 through 3 (509, 511, 513, 515). Transition detect blocks 0 through 3 (509, 511, 513, 515) may be implemented as rising or falling edge detect of oversampled data 3 and 0, oversampled data 0 and 1, oversampled data 1 and 2, and oversampled data 2 and 3, to generate data transitions 0 through 3, respectively.

Accumulator blocks 0 through 3 (517, 519, 521, 523) accumulate data transitions 0 through 3 from transition detect blocks 0 through 3 (509, 511, 513, 515) to generate data transition counts 0 through 3, respectively. Accumulator blocks 0 through 3 (517, 519, 521, 523) may be implemented as incrementing counters. If the four interpolator phases have substantially evenly spaced phase offsets and the period of accumulation starts and stops with substantially the same relative phase offset between remote reference clock 107 and local reference clock 119, then data transition counts 0 through 3 will have substantially equal values. Otherwise, if the phase offsets are unevenly spaced, data transition counts 0 through 3 will have different values and the distribution of the data transition counts 0 through 3 indicates the degree of unevenness. In this case, adjustments are made to interpolator phases 0 through 3 (305, 307, 309, 310) and a new period of accumulation is started. Accumulator blocks 0 through 3 (517, 519, 521, 523) may reset data transition counts 0 through 3 at the start of the new accumulation period.

Error detect block 525 uses data transition counts 0 through 3 from the four accumulator blocks 0 through 3 (517, 519, 521, 523) to determine the amount and the direction of phase adjustments to make to the four interpolator phases 0 through 3 (305, 307, 309, 310). To determine the amount and the direction of phase adjustment, error detect block 525 may first designate one interpolator phase as a reference interpolator phase, calculate phase offsets of the other three non-reference interpolator phases with respect to the reference interpolator phase, and express the phase offsets as a fraction (e.g., a percentage) of a clock period of local reference clock 119. Phase errors for the three non-reference interpolator phases with respect to the reference interpolator phase are then generated by deriving differences between the calculated phase offsets and ideal phase offsets. For example, if interpolator phase 0 (305) is designated as the reference interpolator phase, the ideal phase offset for interpolator phase 1 (307) with respect to interpolator phase 0 (305) as a fraction of the clock period of local reference clock 119 may be ¼. If the calculated phase offset is less than ¼, then error detect block 525 may generate a negative phase error to increase the phase offset between interpolator phases 1 and 0 (307, 305). As an another example, if the ideal phase offset for interpolator phase 2 (309) with respect to interpolator 0 (305) as a fraction of the clock period of local reference clock 119 is ½, and if the calculated phase offset is more than ½, then error detect block 525 may generate a positive phase error to decrease the phase offset between interpolator phases 2 and 0 (309, 305). In one embodiment, to maintain substantially evenly spaced phase offsets between the four interpolator phases 0 through 3 (305, 307, 309, 310), adjustments to only three non-reference interpolator phases are performed. Accordingly, error detect block 525 may generate phase errors for three non-reference interpolator phases as indicated by the three arrows shown from error detect block 525 in FIG. 5.

Clock interpolating block 527 uses the phase errors from error detect block 525 to make adjustments to the non-reference interpolator phases using local reference clock 119.

For example, from the previous example, clock interpolating block 527 may increase the phase offset between interpolator phases 1 and 0 (307, 305) by delaying the sampling edge of interpolator phase 1 (307) when there is a negative phase error between them. Similarly, clock interpolating block 527 may decrease the phase offset between interpolator phases 2 and 0 (309, 305) by advancing the sampling edge of interpolator phase 2 (309) when there is a positive phase error between them. The reference interpolator phase and adjusted non-reference interpolator phases are then used to sample received data in oversampling registers 0 through 3 (501, 503, 505, 507) and to start a new period of accumulation.

Thus, in view of the above discussion, it will be appreciated that clock recovery block 115 repeatedly samples received data with interpolator phases, counts data transitions between sampling edges of the interpolated phases, generates phase errors for non-reference interpolator phases based on the data transition counts, and adjusts the sampling edges of the non-reference interpolator phases to maintain substantially even phase offsets between the interpolator phases.

Figure 6:
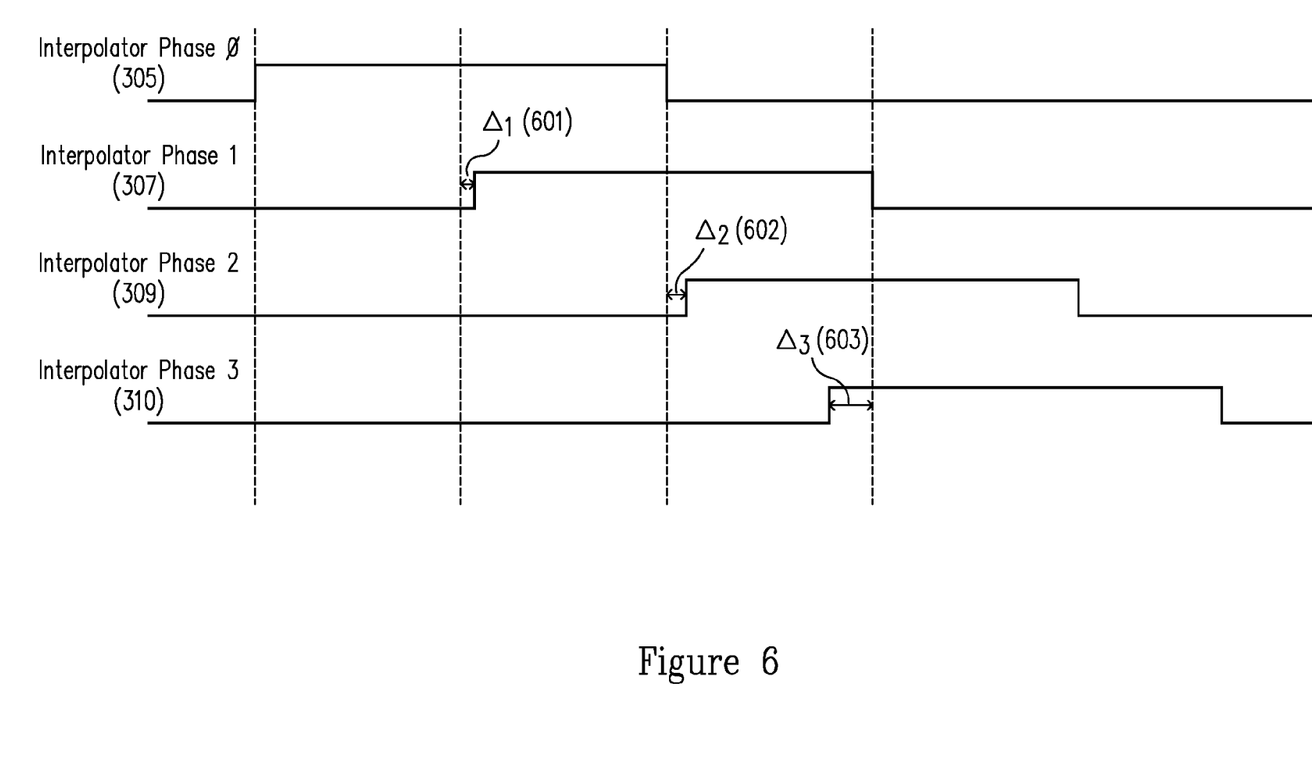
FIG. 6 illustrates deviation from ideal phase offsets for the four interpolator phases of FIG. 5 according to one or more embodiments of the present disclosure.

FIG. 6 illustrates deviation from ideal phase offsets for the four interpolator phases 0 through 3 (305, 307, 309, 310) of FIG. 5 according to one or more embodiments of the present disclosure. Designating interpolator phase 0 (305) as the reference interpolator phase, for evenly spaced phase offsets, non-reference interpolator phases 1 through 3 (307, 309, 310) is desired to have ideal phase offsets of ¼, ½, ¾, respectively, of a clock period of local reference clock 119 from interpolator phase 0 (305).

In FIG. 6, the calculated phase offset between interpolator 1 and 0 (307, 305) is greater than the ideal phase offset of ¼. Phase error $\Delta_1$ (601) represents the extra phase offset of the calculated phase offset from the ideal phase offset. As a result, error detect block 525 of FIG. 5 detects a positive phase error and communicates the same to clock interpolating block 527. In response to the positive phase error, clock interpolating block 527 advances the sampling edge of interpolator phase 1 (307) to try to force phase error $\Delta_1$ (601) to zero.

Similarly, the calculated phase offset between interpolator 2 and 0 (309, 305) is greater than the ideal phase offset of ½. Phase error $\Delta_2$ (602) represents the extra phase offset. In this case, clock interpolating block 527 advances the sampling edge of interpolator phase 2 (309) to also force phase error $\Delta_2$ (602) to zero.

In contrast, the calculated phase offset between interpolator 3 and 0 (310, 305) is less than the ideal phase offset of ¾. Phase error $\Delta_3$ (603) represents the reduced phase offset. As a result, error detect block 525 detects a negative phase error and communicates the same to clock interpolating block 527. In response to the negative phase error, clock interpolating block 527 delays the sampling edge of interpolator phase 3 (310) to force phase error $\Delta_3$ (603) zero.

Figure 7:
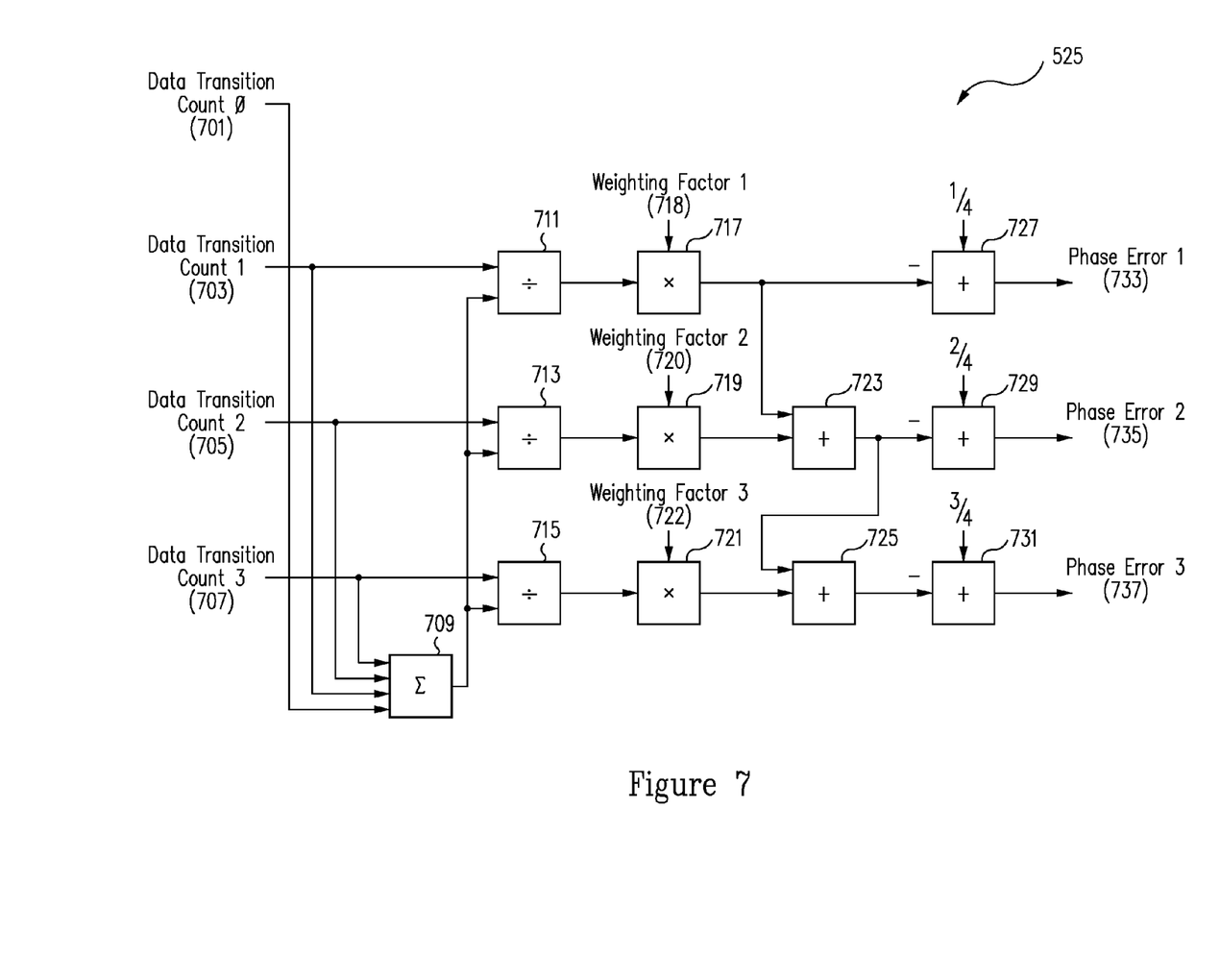
FIG. 7 shows an implementation of an error detect block of FIG. 5 to measure phase errors of interpolated phases according to one or more embodiments of the present disclosure.

FIG. 7 shows an implementation of error detect block 525 of FIG. 5 to measure phase errors of interpolated phases according to one or more embodiments of the present disclosure. Error detect block 525 receives data transition counts 0 through 3 (701, 703, 705, 707) representing accumulated data transitions between sampling edges of interpolated phase pairs 0 and 3 (305, 310), 1 and 0 (307, 305), 2 and 1 (309, 307), and 3 and 2 (310, 309), respectively. The data transition counts are proportional to the phase offsets between sampling edges of the associated interpolated phase pairs. An interpolator phase is selected as the reference interpolator phase. Phase offsets of non-reference interpolator phases with respect to the reference interpolator phase are calculated. Differences between the calculated phase offsets and ideal phase offsets for the non-reference interpolator phases are generated as the phase errors. An optional weighted-average filtering of the calculated phase offsets may be performed to compensate for jitters or other noise effects on the interpolated phases.

Summer block 709 sums all four data transition counts to calculate a sum of the total number of data transitions. In one embodiment, interpolator phase 0 (305) is designated as the reference interpolator phase. Divider blocks 711, 713, 715 divide data transition counts 1 through 3 (703, 705, 707) by the sum of the total number of data transitions to obtain phase offset fractional values expressed as a fraction of a clock period of local reference clock 119 between interpolator phases 1 and 0 (307, 305), 2 and 1 (309, 307), and 3 and 2 (310, 309), respectively. In one embodiment, weighting multiplier blocks 717, 719, 722 implement weighted-average filtering by multiplying the phase offset fractional values provided by divider blocks 711, 713, 715 by weighting factors 1 through 3 (718, 720, 722), respectively. Weighted-average filtering may compensate for jitters or other phase noise effects on the interpolated phases through the use of non-uniform weighting factors. In another embodiment, a straight averaging filter may be implemented by making weighting factors 1 through 3 (718, 720, 722) all the same. Weighting factors may be determined through analyses of the statistical variations of the calculated phase offsets. The outputs from the weighting multiplier blocks 717, 719, 722 provide weighted phase offset values between interpolator phases 1 and 0 (307, 305), 2 and 1 (309, 307), and 3 and 2 (310, 309), respectively.

Using the weighted phase offset values, phase offsets for interpolator phases 1 through 3 (307, 309, 310) with respect to interpolator phase 0 (305) expressed as a fraction of a clock period of local reference clock 119 may be calculated. For interpolator phase 1 (307), the calculated phase offset comes directly from the weighted phase offset value provided by weighting multiplier 717. However, for interpolator phases 2 and 3 (309, 310), the calculated phase offsets may take into account all the intervening interpolator phases between interpolator phases 2, 3 (309, 310) and interpolator phase 0 (305). In one embodiment, the calculated phase offset for interpolator phase 2 (309) with respect to interpolator phase 0 (305) is a sum of the weighted phase offset value between interpolator phase 1 and 0 (307, 305) and the weighted phase offset value between interpolator phase 2 and 1 (309, 307). Therefore, adder block 723 adds weighted phase offset values from weighting multiplier blocks 717 and 719 to obtain the calculated phase offset for interpolator phase 2 (309) with respect to interpolator phase 0 (305). Similarly, adder block 725 adds weighted phase offset values from weighting multiplier blocks 717, 719, 721 to obtain the calculated phase offset for interpolator phase 3 (310) with respect to interpolator phase 0 (305).

Adder blocks 727, 729, 731 generate phase errors 1 through 3 (733, 735, 737) by subtracting the calculated phase offsets for interpolator phases 1 through 3 (307, 309, 310) from their ideal phase offsets, respectively. In one embodiment, the ideal phase offsets for interpolator phases 1 through 3 (307, 309, 310) are ¼, ½, and ¾, respectively, based on evenly spaced phase offsets. Phase errors 1 through 3 (733, 735, 737) provided by adder blocks 727, 729, 731 may have sign and magnitude components. The sign of a phase error indicates whether the sampling edge of an associated interpolator phase is earlier or later than the ideal phase offset. The magnitude of a phase error indicates how much (e.g., early or how much late) the sampling edge of an associated interpolator phase deviates from the ideal phase offset. Clock interpolating block 527 uses the phase errors 1 through 3 to adjust the sampling edges of interpolator phases to drive the phase errors 1 through 3 toward zero.

Figure 8:
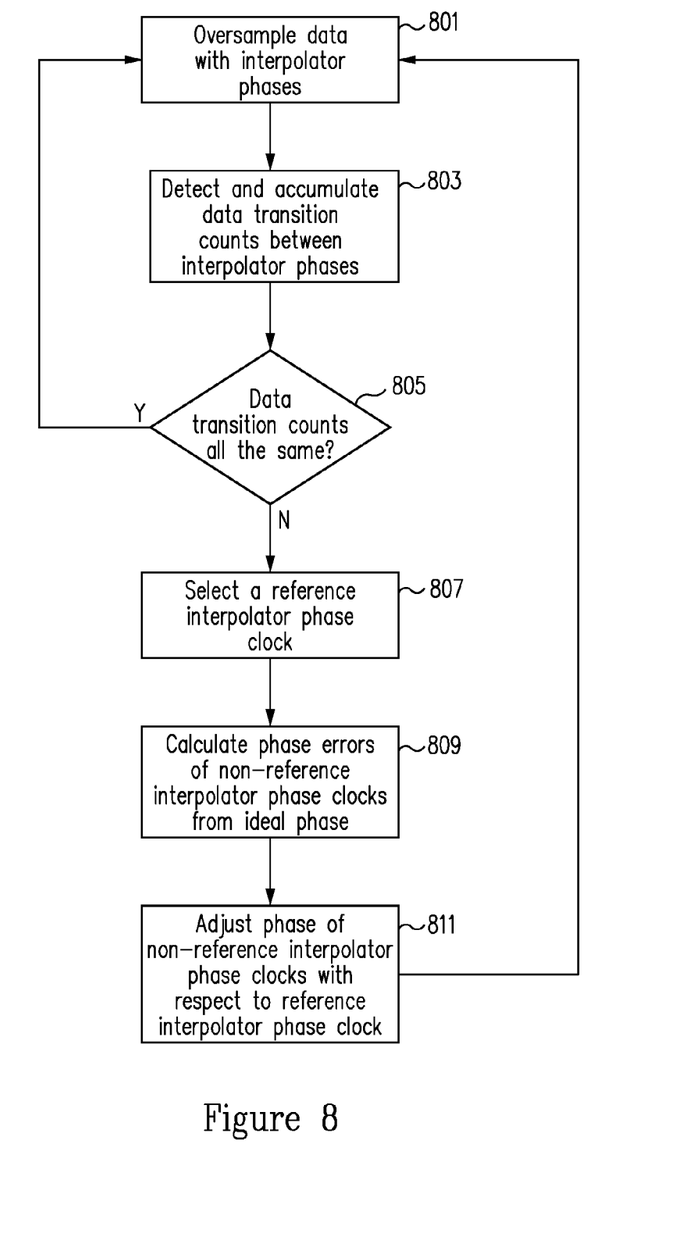
FIG. 8 shows a flow chart of the processing steps for maintaining even phase offsets between interpolator phase clocks according to one or more embodiments of the present disclosure.

FIG. 8 shows a flow chart of processing steps for maintaining substantially evenly spaced phase offsets between interpolator phases 0 through 3 (305, 307, 309, 310) of FIG. 5 according to one or more embodiments of the present disclosure. Interpolator phases 0 through 3 (305, 307, 309, 310) may be generated from a local reference clock 119 so that interpolator phases 0 through 3 (305, 307, 309, 310) have the same frequency but different phase offsets that are substantially evenly distributed within one or multiple clock periods of local reference clock 119. The frequency of interpolator phases 0 through 3 (305, 307, 309, 310) may be the same as, or may be divided down from, the frequency of local reference clock 119. To measure phase offsets between interpolator phases 0 through 3 (305, 307, 309, 310), interpolator phases 0 through 3 (305, 307, 309, 310) are used to sample received data having a frequency that is not synchronized to the frequency of local reference clock 119. The lack of synchronicity between local reference clock 119 and the received data causes data transitions of the received data to drift across the phase offsets between interpolator phases 0 through 3 (305, 307, 309, 310). By measuring the number of data transitions between the sampling edges of interpolator phases 0 through 3 (305, 307, 309, 310), deviations of interpolator phases 0 through 3 (305, 307, 309, 310) from evenly spaced phase offsets are detected. The phase offset deviations are used to adjust interpolator phases 0 through 3 (305, 307, 309, 310) to drive the phase offset deviations toward zero. Data recovery may then be facilitated by selecting an interpolated phase with a sampling edge that is closest to the center of a data period, or closest to the midpoint between data transitions to sample the received data.

The particular steps of FIG. 8 will now be described with reference to the embodiments disclosed in previous figures. Such embodiments are used to illustrate but do not limit the steps of FIG. 8. In this regard, it will be appreciated that the steps of FIG. 8 may also be practiced using other embodiments. In step 801 oversampling registers 0 through 3 (501, 503, 505, 507) of FIG. 5 oversample received data using interpolator phases 0 through 3 (305, 307, 309, 310). Data transitions of received data 203 are asynchronous to the interpolator phases 0 through 3 (305, 307, 309, 310), causing the data transitions to drift across phase offsets between adjacent pairs of interpolator phases (e.g., between interpolator phases 3 and 0, 0 and 1, 1 and 2, 2 and 3). Over a sufficiently long period of time, the number of data transitions should be substantially evenly distributed across the four phase offsets if interpolator phases 0 through 3 (305, 307, 309, 310) have substantially evenly spaced phase offsets.

In step 803, transition detect blocks 0 through 3 (509, 511, 513, 515) of FIG. 5 check for differences between over-sampled data of adjacent pairs of interpolator phases to detect data transitions in the corresponding phase offsets. Accumulator blocks 0 through 3 (517, 519, 521, 523) of FIG. 5 accumulate the number of data transitions within each of the four phase offsets to generate four data transition counts as described for FIG. 5. In step 805, at the end of an accumulation period, error detect block 525 of FIG. 5 compares the data transition counts for the four phase offsets. If the data transition counts are the same, then interpolator phases 0 through 3 (305, 307, 309, 310) have evenly spaced phase offsets and no adjustments are made to their phases. The data transitions counts for the four phase offsets are reset for the next accumulation period. Steps 801 and 803 are repeated for interpolator phases 0 through 3 (305, 307, 309, 310) to generate a new set of data transition counts for the next accumulation period.

On the other hand, if the data transition counts for the four phase offsets are not the same, then adjustments are made to the phases of interpolator phases 0 through 3 (305, 307, 309, 310). In step 807, one of the four interpolator phases 0 through 3 (305, 307, 309, 310) is selected as a reference interpolator phase. In one embodiment, as shown in FIG. 7, interpolator phase 0 (305) is selected as the reference interpolator phase. Phase adjustments are made to the non-reference interpolator phases 1 through 3 (307, 309, 310).

In step 809, summer block 709, divider blocks 711, 713, 715, and adder blocks 723, 725 of FIG. 7 calculate phase offsets for the non-reference interpolator phases 1 through 3 (307, 309, 310) using the data transition counts. Divider blocks 711, 713, 715 divide data transition counts associated with the non-reference interpolator phases 1 through 3 (307, 309, 310) by a sum of all data transition counts to obtain phase offset fractional values for the non-reference interpolator phases 1 through 3 (307, 309, 310). Adder blocks 723, 725 calculate phase offsets for a non-reference interpolator phase with respect to the reference interpolator phase (e.g., interpolator phase 0 (305)) by adding the phase offset fractional values for all intervening interpolator phases from the reference interpolator phase to the non-reference interpolator phases. For example, the phase offset for interpolator phase 3 with respect to the interpolator phase 0 is the sum of phase offset fractional values for interpolator phases 1, 2, and 3. Weighting multiplier blocks 717, 719, 722 of FIG. 7 may implement an optional weighted-average filtering of the calculated phase offsets. Adder blocks 727, 729, 731 of FIG. 7 compare the calculated phase offsets against ideal phase offsets for the non-reference interpolator phase 1 through 3 (307, 309, 310) to generate phase errors. The ideal phase offsets are based on the interpolator phases 0 through 3 (305, 307, 309, 310) having evenly spaced phase offsets.

In step 811, clock interpolating block 527 of FIG. 5 uses the phase errors from step 809 to adjust the phases of non-reference interpolator phases 1 through 3 (307, 309, 310) to drive the phase errors toward zero. For example, if the phase error indicates that an interpolator phase is earlier than its ideal phase offset, then clock interpolating block 527 delays the phase of the sampling edge of the interpolator phase by the magnitude of the phase error. After the phase adjustments, the data transitions counts for the four phase offsets are reset and the steps of FIG. 8 are repeated for the next accumulation period.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method of adjusting a plurality of interpolating clocks having a first frequency and different phase offsets, the method comprising:
    receiving a serial stream of data bits of a data signal clocked at a second frequency;
    accumulating by counting with a clock recovery block a number of data transitions of the data bits occurring during respective phase offsets corresponding to respective time intervals that elapse between respective sampling edges of corresponding successive pairs of the interpolating clocks, to generate a respective data bit transition count for each interpolating clock;
    comparing the respective data bit transition counts;
    adjusting the respective phase offsets of the interpolating clocks in response to the comparing; and
    repeating the accumulating by counting, comparing, and adjusting until the respective data bit transition counts for all the interpolating clocks differ by no more than a desired value wherein the respective phase offsets of the interpolating clocks are evenly spaced when the respective data bit transition counts are equal.

2. The method of claim 1, wherein the accumulating of the number of data transitions of the data bits is performed for a period of time sufficiently long to allow the data transitions of the data bits to drift over at least an integer multiple of a period of the first frequency.

3. The method of claim 1, further comprising resetting the respective data bit transition counts before the repeating.

4. The method of claim 1, wherein each data bit exhibits one of a plurality of different states, wherein the serial stream is coded to provide approximately equal numbers of the different states.

5. The method of claim 4, wherein the serial stream exhibits a high transition density to allow an average of the respective data bit transition counts for all interpolating clocks to be of at least a desired value.

6. The method of claim 4, wherein the plurality of different states is 2 states.

7. The method of claim 1, wherein each of the successive pairs of interpolating clocks comprises a pair of interpolating clocks with no intervening interpolating clock between the pair of interpolating clocks.

8. The method of claim 1, wherein the comparing of the respective data bit transition counts comprises:
 calculating a sum of the respective data bit transition counts of all interpolating clocks;
 selecting a first interpolating clock as a reference interpolator phase;
 selecting the remaining interpolating clocks as non-reference interpolator clocks;
 dividing the respective data bit transition count for each of the non-reference interpolating clocks by the sum to generate a phase offset fractional value for the non-reference interpolating clocks;
 calculating a respective calculated phase offset for each of the non-reference interpolating clocks with respect to the reference interpolator phase by adding the phase offset fractional values for all intervening interpolating clocks from the reference interpolator phase to the non-reference interpolating clock; and
 calculating a difference between the respective calculated phase offset and an ideal phase offset to generate a respective phase error for each of the non-reference interpolating clocks.

9. The method of claim 8, wherein the adjusting of the respective phase offsets of the interpolating clocks results in the respective phase error approaching zero for each interpolating clock.

10. The method of claim 8, wherein calculating the respective calculated phase offset for each of the non-reference interpolating clocks with respect to the reference interpolator phase further comprises multiplying the phase offset fractional value by a weighting factor to generate a weighted phase offset value, and adding the weighted phase offset values for all intervening interpolating clocks from the reference interpolator phase to the non-reference interpolating clock.

11. The method of claim 1, wherein the first frequency is approximately equal to the second frequency.

12. A clock recovery apparatus comprising:
 a plurality of oversampling registers adapted to sample a serial stream of data bits of a data signal to generate oversampled data using sampling edges of a plurality of corresponding interpolating clocks, wherein the interpolating clocks have a first frequency and different respective phase offsets, and wherein the serial stream of data bits is clocked at a second frequency;
 a transition detect block adapted to receive the oversampled data to detect data transitions occurring between the sampling edges of adjacent interpolating clocks;
 an accumulator block adapted to accumulate by counting the data transitions to generate data transition counts occurring between the sampling edges of the adjacent interpolating clocks over an accumulation period;
 an error detect block adapted to compare the data transition counts from the accumulator block to generate respective phase errors representing deviations of the respective phase offsets of the plurality of interpolating clocks from a desired phase offset; and
 a clock interpolating block adapted to generate the plurality of interpolating clocks from a reference interpolator phase and to adjust the respective phase offsets of the plurality of interpolating clocks in response to the respective phase errors from the error detect block.

13. The apparatus of claim 12, wherein the accumulation period is sufficiently long to allow the data transitions to drift over at least an integer multiple of a period of the first frequency.

14. The apparatus of claim 13, wherein the data transition counts for accumulator block are reset before starting the accumulation period.

15. The apparatus of claim 12, wherein the serial stream exhibits a high transition density to allow an average of the data transition counts from the accumulator block to be of at least a desired value.

16. The apparatus of claim 12, wherein the adjacent interpolating clocks comprise pairs of interpolating clocks with no intervening interpolating clock between each of the pairs.

17. The apparatus of claim 12, wherein the error detect block comprises:
 a first block adapted to select a interpolating clock as a reference interpolator phase and to use the data transition counts from the accumulator block to generate respective calculated phase offsets for the remaining interpolating clock with respect to the reference interpolator phase; and
 a second block adapted to calculate differences between the respective calculated phase offsets and ideal phase offsets based on the plurality of interpolating clocks having equal phase offsets to generate the phase errors for the remaining interpolating clocks.

18. The apparatus of claim 17, wherein the clock interpolating block is adapted to adjust the respective phase offsets of the remaining interpolating clocks to result in the respective phase errors approaching zero.

19. The apparatus of claim 17, wherein the first block comprises:
 a divider block adapted to divide the data transition counts by a sum of all the data transition counts to generate respective phase offset fractional values for each of the remaining interpolating clocks; and
 an adder block adapted to add the respective phase offset fractional values for all intervening interpolating clocks from the reference interpolator phase to each of the remaining interpolating clocks to generate the calculated respective phase offsets.

20. The apparatus of claim 19, further comprising a weighting multiplier block adapted to multiply the respective phase offset fractional values by weighting factors to generate respective weighted phase offset values for the adder block to add the respective weighted phase offset values in place of the respective phase offset fractional values.

21. The apparatus of claim 12, wherein the first frequency is approximately equal to the second frequency.

22. A non-transitory machine readable medium adapted to store a plurality of machine readable instructions which when executed are adapted to cause a data communication device to perform a method of adjusting a plurality of interpolating clocks having a first frequency and different phase offsets, the method comprising:
 receiving a serial stream of data bits of a data signal clocked at a second frequency;
 accumulating by counting with a clock recovery block a number of data transitions of the data bits occurring during respective phase offsets corresponding to respective time intervals that elapse between respective sampling edges of successive pairs of the interpolating clocks, to generate a respective data bit transition count for each interpolating clock;
 comparing the respective data bit transition counts;

adjusting the respective phase offsets of the interpolating clocks in response to the comparing; and repeating the accumulating by counting, comparing, and adjusting until the respective data bit transition counts for all the interpolating clocks differ by no more than a desired value, wherein the respective phase offsets of the interpolating clocks are evenly spaced when the respective data bit transition counts are equal.

* * * * *